United States Patent [19]
Mavretic et al.

[11] Patent Number: 5,654,679
[45] Date of Patent: Aug. 5, 1997

[54] APPARATUS FOR MATCHING A VARIABLE LOAD IMPEDANCE WITH AN RF POWER GENERATOR IMPEDANCE

[75] Inventors: Anton Mavretic, Marlton; Andrew Ciszek, Maple Shade; Joseph Stach, Medford, all of N.J.

[73] Assignee: RF Power Products, Inc., Voorhees, N.J.

[21] Appl. No.: 662,886

[22] Filed: Jun. 13, 1996

[51] Int. Cl.[6] .................................................. H03H 7/40
[52] U.S. Cl. .............................. 333/17.3; 333/32
[58] Field of Search .................... 333/17.3, 99 PL, 333/32; 343/861; 315/111.21

[56] References Cited

U.S. PATENT DOCUMENTS

| | | | |
|---|---|---|---|
| 2,981,902 | 4/1961 | Familier | 333/17.3 X |
| 5,424,691 | 6/1995 | Sadinsky | 333/17.3 |

*Primary Examiner*—Paul Gensler
*Attorney, Agent, or Firm*—Blakely, Sokoloff, Taylor & Zafman LLP

[57] ABSTRACT

An apparatus for matching the variable impedance of a load with the fixed impedance of a radio frequency (RF) power generator to provide maximum power transfer. The impedance matching network further allows an RF power generator to vary the frequency of the voltage applied to a load, e.g., a plasma chamber as may be utilized in semiconductor or flat panel plasma display manufacturing processes. The impedance matching network further utilizes fixed solid state components to adjust the impedance of the attached load to provide maximum power transfer between the generator and the load. A parallel switched capacitor network is controlled by an electrical switching means such as PIN diodes to turn fixed capacitors on or off. A means for varying the frequency of the applied voltage is used to match the impedance of the load with the impedance of the RF power generator within milliseconds.

17 Claims, 6 Drawing Sheets

APPARATUS FOR MATCHING A VARIABLE LOAD IMPEDANCE WITH AN RF POWER GENERATOR IMPEDANCE

BACKGROUND OF THE INVENTION

1. Field of the Invention

The present invention relates to the field of impedance matching networks. More specifically, the present invention relates to a method and apparatus for matching the impedance of a load with the internal impedance of a radio frequency (RF) power generator to provide maximum power transfer, where the frequency of the applied voltage generated by the RF power generator and the impedance of the load may independently vary.

2. Description of the Related Art

The Federal Communications Commission (FCC) has designated Industrial, Scientific and Medical (ISM) frequencies at 13.56 MHz, 27.12 MHz and 40.68 MHz, respectively. ISM frequencies may be radiated by equipment into the atmosphere without concern for causing radio frequency disturbances to other equipment. Plasma etch and deposition equipment manufacturers have traditionally used the 13.56 MHz frequency to operate a plasma chamber for manufacturing integrated circuits and plasma displays. However, ISM frequencies do not always provide an optimum frequency at which to operate a plasma chamber to achieve critical process steps, especially in view of decreasing integrated circuit dimensions. As a result, equipment manufacturers have developed plasma chambers that are capable of operating over a range of frequencies.

ISM-based RF power generators, however, are commonly designed to assure minimum deviation from a set ISM frequency, e.g., 13.56 MHz. In contrast, a variable frequency RF power generator ("generator") may be coupled to a load, e.g., a plasma chamber, to manipulate the frequency of the voltage applied to the load so that the load may be operated over a range of voltage frequencies. However, in an alternating current (AC) circuit, impedance is affected by the frequency of the applied voltage, which impedance, in turn, affects the transfer of power between the generator and the load. Moreover, the impedance of a plasma chamber may vary independent of the frequency of the applied voltage depending on such variables as chamber pressure, gas composition, and plasma ignition. What is needed, therefore, is an impedance matching network that allows the frequency of the applied voltage to vary while maintaining the impedance of the load with respect to the generator, i.e., the input impedance to the generator.

As is well known to those of ordinary skill in the related art, impedance for a given circuit may be comprised of both a resistive component and a reactive component, the latter of which may be either inductive or capacitive. Maximum power transfer bet,ween a generator and an attached load is achieved when the resistance of the load is equal to the internal resistance of the generator and the net reactance between the load and generator is zero. Thus, it is advantageous to counterbalance the reactance between the generator and the load to achieve a net reactance of zero. A net reactance of zero between the generator and load occurs when the impedance of the load is the conjugate of the internal impedance of the generator. Thus, if the generator has an inductive reactance, then a load that has a capacitive reactance of equal magnitude and opposite phase will result in a net reactance of zero to the circuit comprising the generator and the load, and vice versa. An impedance matching network may be utilized to maintain an input impedance that is the conjugate of the internal impedance of the generator as the frequency of the voltage applied by the generator to the load varies, and/or as the impedance of the load varies, so that maximum power transfer occurs between the generator and the load.

With reference to FIG. 1, a prior art impedance matching network 100 is illustrated. An RF power generator can be coupled to RF input 120. A load such as a plasma chamber can be coupled to RF output 130. The impedance matching network 100 ("network") comprises a phase detector 101 that samples the transmission line 108 at a fixed impedance, e.g., 50 ohms, and generates a signal over line 112 to control board 110. Control board 110 then causes servo motor 107 to turn variable capacitor 106, depending on the polarity of the phase shift between the input RF voltage and current caused by a non-linear impedance in the load, e.g., as occurs under ignited plasma conditions in a plasma chamber.

Magnitude detector 109 also samples the deviation from an impedance of, e.g., 50 ohms, on transmission line 108, and generates a signal over line 111 to control board 110 based thereon. Control board 110 then causes servo motor 103 to turn variable capacitor 102. The capacitance provided by capacitor 102 is also dependent, to a lesser extent, on the polarity of the phase shift between the RF voltage and current. The magnitude detector 109 detects the deviation from a characteristic impedance of, for example, 50 ohms. If the impedance in line 108 is greater than 50 ohms, the signal transmitted over line 111 is positive, and if the impedance in line 108 is less than 50 ohms, the signal transmitted over line 111 is negative. As can be seen, the prior art impedance matching network 100 is relatively slow because of the time needed for servo motors 103 and 107 to turn capacitors 102 and 106, respectively, to match the impedance of the generator with the impedance of the load. Moreover, the network 100 does not allow the generator to change the frequency of the applied voltage as may be desired depending on the load.

Today, semiconductor and flat panel plasma display equipment manufacturing process times are decreasing, such that the amount of time required to establish matching impedance between an RF power generator and a plasma chamber (whose operating frequency and impedance varies) is a limiting factor affecting throughput on the manufacturing line. What is needed is an impedance matching network coupling a generator to a load, e.g., a plasma chamber, that allows the generator to vary the frequency of the voltage applied to the load and utilizes fixed solid state components to rapidly and accurately adjust the input impedance of the attached load to maintain maximum power transfer to the load.

SUMMARY OF THE DISCLOSURE

The present invention is related to the field of impedance matching networks. More specifically, the present invention relates to a method and apparatus for matching the variable impedance of a load with the fixed internal impedance of a radio frequency (RF) power generator ("generator") to provide maximum power transfer to the load, where the frequency of the applied voltage generated by the RF power generator and the impedance of the load may independently vary. The impedance matching network allows a generator to vary the frequency of the voltage applied to a load, for example, a plasma chamber, as may be utilized in semiconductor or flat panel plasma display manufacturing processes. The impedance matching network further utilizes fixed solid state components to adjust, within milliseconds, the input impedance of the attached load to accomplish maximum power transfer to the load. A means for varying the frequency of the applied voltage and a parallel switched capacitor network for very quickly matching the input impedance of the load with the impedance of the generator is used.

It is an object of the impedance matching network as may be utilized by the present invention to improve the performance of prior art impedance matching networks by reducing impedance matching convergence times, decrease impedance matching network circuit size for easier chamber mounting, and provide impedance load independence.

It is a further object of the present invention to increase the reliability of an impedance matching network by eliminating mechanical moving parts such as variable, vacuum-type capacitors and servo motors in favor of an electronically controlled impedance matching network having solid state components, thereby eliminating the maintenance and calibration requirements associated with prior art impedance matching networks.

BRIEF DESCRIPTION OF THE DRAWINGS

The present invention is illustrated by way of example and not limitation in the following figures. Like references indicate similar elements, in which.

DETAILED DESCRIPTION OF THE EMBODIMENTS OF THE INVENTION

Described herein is a method and apparatus for matching the variable impedance of a load with the fixed impedance of a radio frequency (RF) power generator ("generator") to provide maximum power transfer from the generator to the load, where the generator varies the frequency of the voltage applied to the load. In the following description, numerous specific details and examples are set forth in order to provide a thorough understanding of the present invention. It will be apparent, however, to one of ordinary skill in the art that the present invention may be practiced in this or related fields without this specific information. In other instances, well-known circuits, components, and techniques have not been shown in order not to unnecessarily obscure the present invention.

OVERVIEW OF AN EMBODIMENT OF THE PRESENT INVENTION

Figure 2:
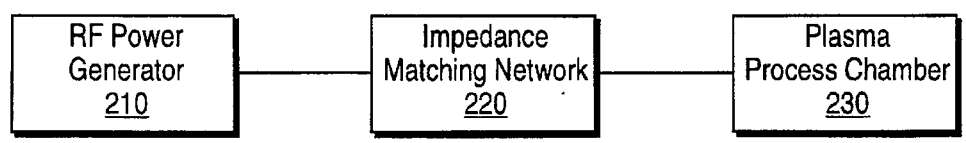
FIG. 2 is a block diagram of an embodiment of the present invention.

The increasing complexity of present and future generation plasma processing requirements significantly impacts the performance requirements of radio frequency (RF) power generators and related impedance matching networks used in this field. Plasma processing equipment manufacturers continue to reduce process times, modify plasma chamber pressures and gas compositions, and decrease plasma chamber cleaning cycle times in order to increase throughput, provide consistent production and reliable performance. To that end, prior art motor driven impedance matching networks are being replaced by faster, electronically controlled impedance matching networks. As the block diagram in FIG. 2 illustrates, an embodiment of the present invention provides a solid state impedance matching network 220 ("network 220") that employs no moving electrical or mechanical parts to maintain an input impedance of, for example, 50 ohms, and allow an RF power generator 210 ("generator 210") to vary the frequency of the applied voltage around a base frequency to achieve, among other things, plasma ignition in the plasma process chamber 230 ("plasma chamber").

Figure 3:
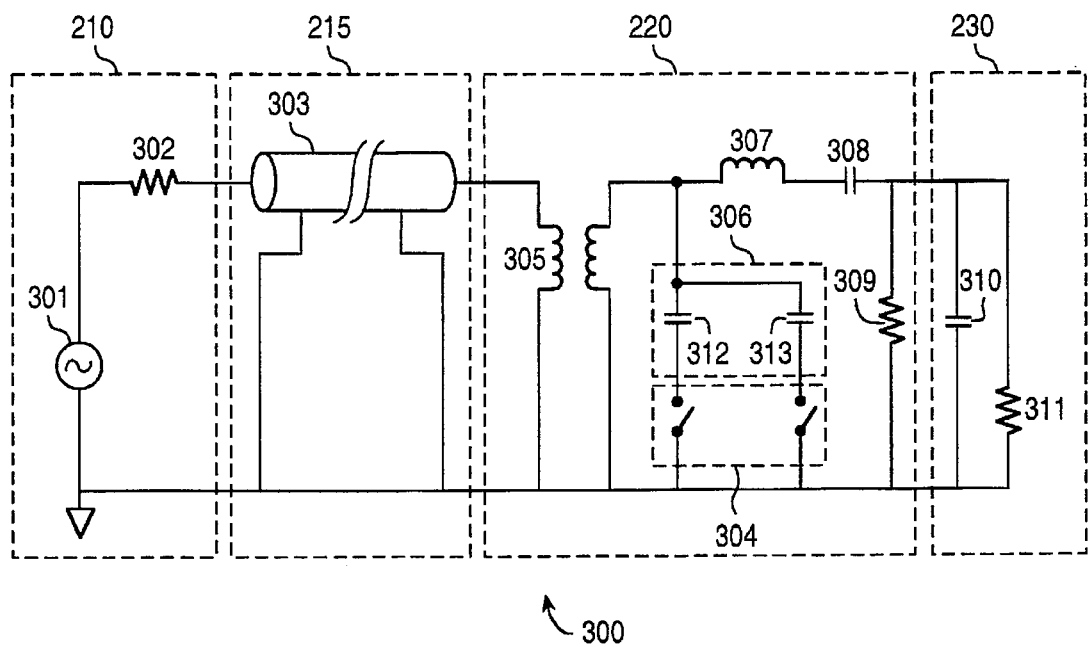
FIG. 3 is a schematic diagram providing an electrical representation of an embodiment of the present invention.

FIG. 3 is an electrical schematic representing the RF power generator 210, impedance matching network 220, connector 215 connecting generator 210 to network 220, and plasma processing chamber 230 coupled to network 220. The generator 210 is comprised of an alternating current power supply 301 and an internal impedance 302. The power provided by the generator 210 may be variable from 0 watts to 5 kilowatts. The generator base frequency is arbitrary. However, it is common practice in the semiconductor industry to use the ISM frequency of 13.56 MHz. The generator's internal impedance 302 is generally 50 ohms, but the impedance could be any value, as long as the cable 303 delivering power to the network 220 has the same characteristic impedance.

Within the impedance matching network 220, RF transformer 305 may or may not be utilized. The purpose of transformer 305 is to further transform the input impedance from 50 ohms to some lower value, e.g., 12.5 ohms, so that the portion of the impedance matching network to the right of the transformer 305 will operate at a lower impedance level.

A capacitance 306 is comprised of at least one fixed-value capacitor 312. In one embodiment, an additional number of capacitors may be coupled in parallel to capacitor 312, as is illustrated by capacitor 313. Sufficient capacitors may be coupled in parallel to capacitor 312 to provide, for example, 8, 16, or more discrete values. The capacitors are electrically and individually switched by respective switches in switch circuit 304. In one embodiment, diodes with a large intrinsic region between p- and n-doped semiconducting regions, hereafter referred to as PIN diodes, may be utilized to provide the switching function. In a second embodiment, switch circuit 304 is comprised of RF relays.

Inductance 307 is a fixed value as well. The value of resistance 309 is selected to maintain the capacitance 306 discharged under no plasma ignition conditions. The portion of network 220 comprised of capacitance 306, induction 307, and capacitance 308 is a typical L-type impedance matching network configuration. With respect to the plasma chamber 230, capacitive component 310 and resistive component 311 are the equivalent capacitance and resistance representing a plasma chamber when ignited.

Figure 4:
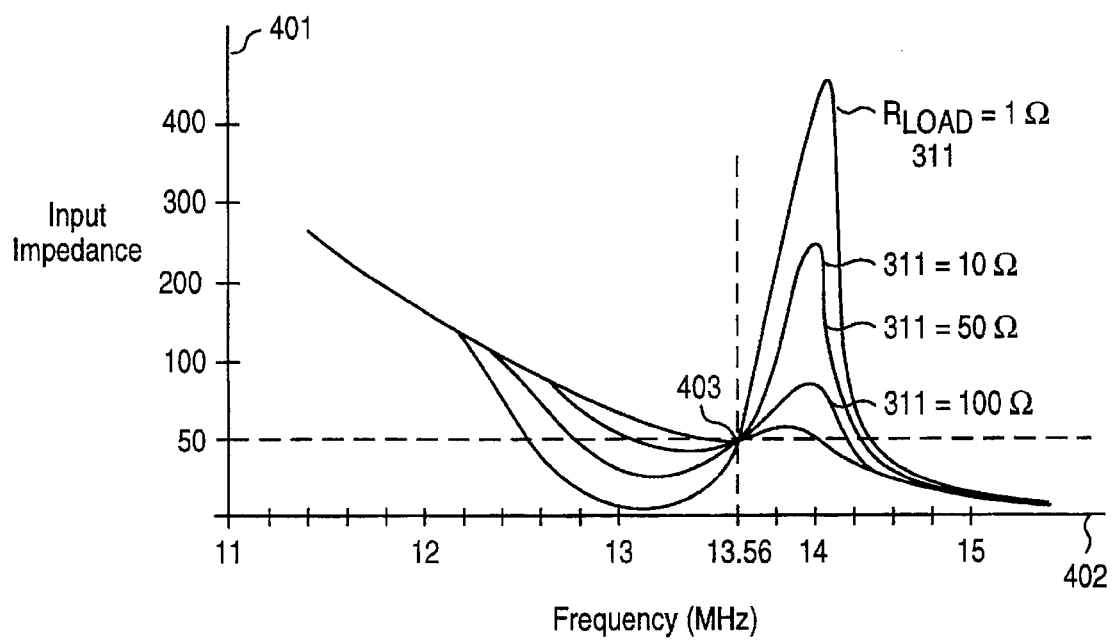
FIG. 4 provides a graphical analysis of the simulation of input impedance versus varying load impedance for the circuit in FIG. 3.

FIG. 4 provides a graphical analysis of a simulation of input impedance versus varying load impedance for the circuit in FIG. 3, in which it is demonstrated that a constant input impedance, i.e., the impedance seen by the generator 210 from the load, is maintained by network 220 over a load impedance range of 1 to 100 ohms (typical resistive loads for ignited plasma conditions in a plasma chamber are from 1 to 100 ohms). The vertical axis 401 represents the input impedance while the horizontal axis represents the frequency of the applied voltage. In the simulation, both the frequency of the applied voltage and the resistive load component 311 are varied. The capacitive load component 310 is maintained as a constant.

Regardless of the value of the resistive load, all the curves in FIG. 4 go through point 403 where input impedance is 50 ohms and the frequency of the applied voltage is 13.56 MHz. In the case where the load is a plasma chamber, it is advantageous to select values of capacitance 306, inductance 307, and capacitance 308 in the impedance matching network 220 such that those impedance and frequency conditions are satisfied. However, it is well understood by those of ordinary skill in the related art that other values of inductance and capacitance may be chosen, depending on the type of load coupled to the impedance matching network 220.

Figure 5:
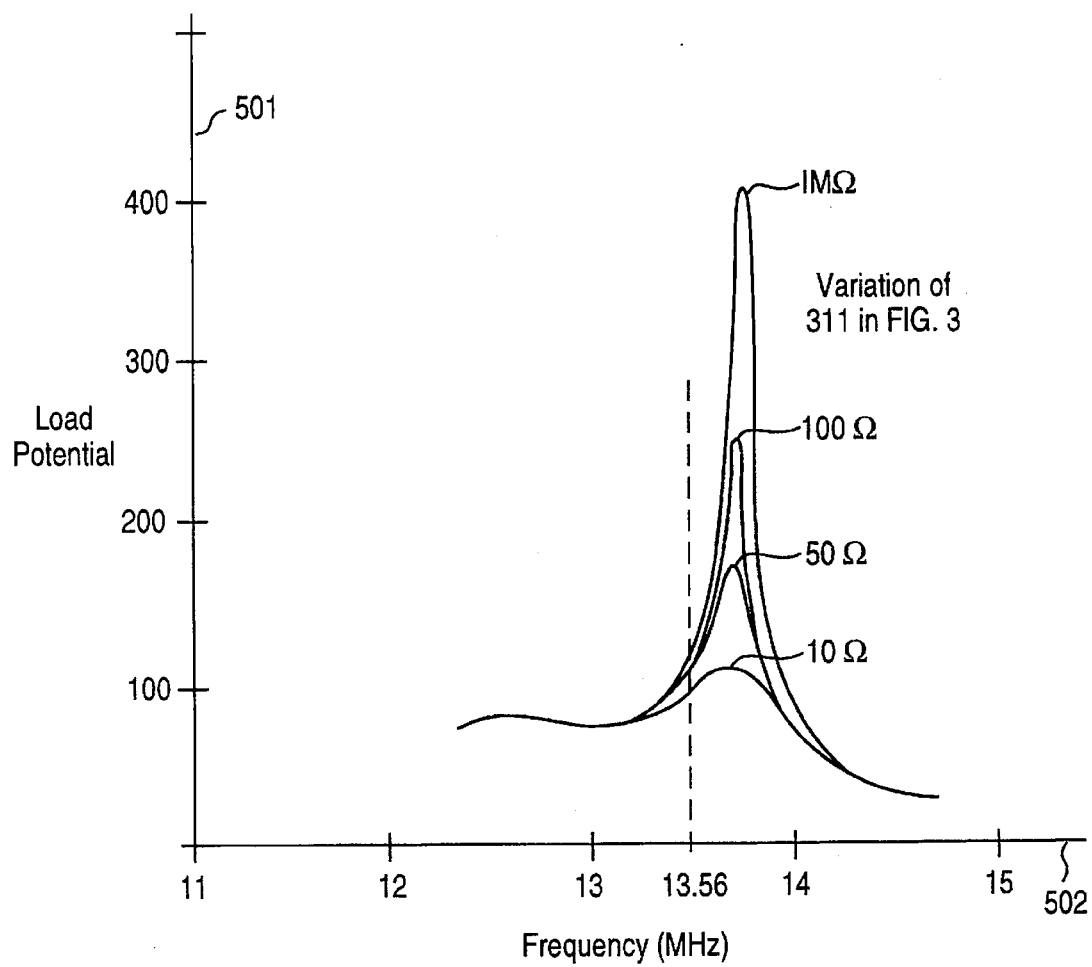
FIG. 5 graphically illustrates varying the frequency of voltage applied to a load.

FIG. 5 graphically illustrates a simulation of plasma ignition in a plasma chamber coupled to the impedance matching network 220 of FIG. 3, where the frequency of the applied voltage increases to slightly above 13.56 MHz, then returns to 13.56 MHz during the processing cycle within a period of milliseconds. The vertical axis 501 represents the applied voltage on capacitive and resistive load components 310 and 311 in FIG. 3, while the horizontal axis 502 represents the frequency of the applied voltage.

The analysis illustrates that the applied voltage peaks slightly above 13.56MHz at levels high enough to strike the plasma, as desired. As can be seen, the frequency of the applied voltage is swept above 13.56 MHz to the voltage peak, at which point the plasma is struck before the frequency of the applied voltage automatically returns to 13.56 MHz.

This graph illustrates a series of curves for various plasma chamber impedances. The resistive load component 311 in FIG. 3 is the characteristic impedance of the plasma chamber chemistry. While it is not necessary for purposes of understanding the present invention to fully describe the various plasma chambers, in general, this method of varying the frequency of the applied voltage is valid for all plasma chambers. It should be noted that the impedance matching network 220 develops a high voltage at the beginning of the plasma processing cycle. The high voltage is needed to start ionization and, hence, plasma ignition, as the voltage peaking in FIG. 5 illustrates. The plasma processing cycle is the elapsed time that the plasma is ignited. A typical time is a few seconds, however, in some cases, it may be longer. As will be discussed in greater detail, the impedance matching capability of the network 220 in FIG. 3 is accomplished by changing the frequency of the applied voltage and changing, via solid state components, the capacitance of the impedance matching network 220 in response thereto.

DETAILED DESCRIPTION OF AN EMBODIMENT OF THE PRESENT INVENTION

An impedance matching network as may be embodied by the present invention provides maximum power transfer between an RF power generator and a load, e.g., a plasma chamber. The impedance matching network provides an input impedance that matches the internal impedance of the RF power generator, typically 50 ohms, while providing an impedance to the plasma chamber that matches the varying impedance of the plasma chamber.

The impedance of the plasma chamber varies according to the stage at which it is operating. For example, before plasma ignition, the impedance of the plasma chamber is as high as 10 megaohms, while after ignition the impedance is approximately 2 ohms. When the plasma is not yet ignited, the plasma chamber is essentially a vacuum chamber and high voltages are required to ignite the plasma, hence, the high impedance. The impedance may further vary during operation, depending on a number of factors, including the size of the plasma chamber, gas chemistry, and gas pressure. At some point in the process cycle, a chemical mixture of gases is pushed into the plasma chamber. The gases may be used for etching, deposition, or cleaning target material in the plasma chamber. The ionized gases inside the plasma chamber present low impedance to the impedance matching network 220 that is supplying RF power to the plasma chamber. To maximize power transfer between the generator and the plasma chamber, the impedance matching network needs to respond to impedance changes in the plasma chamber in the shortest time reasonably possible, e.g., within 100 milliseconds or less.

Figure 6:
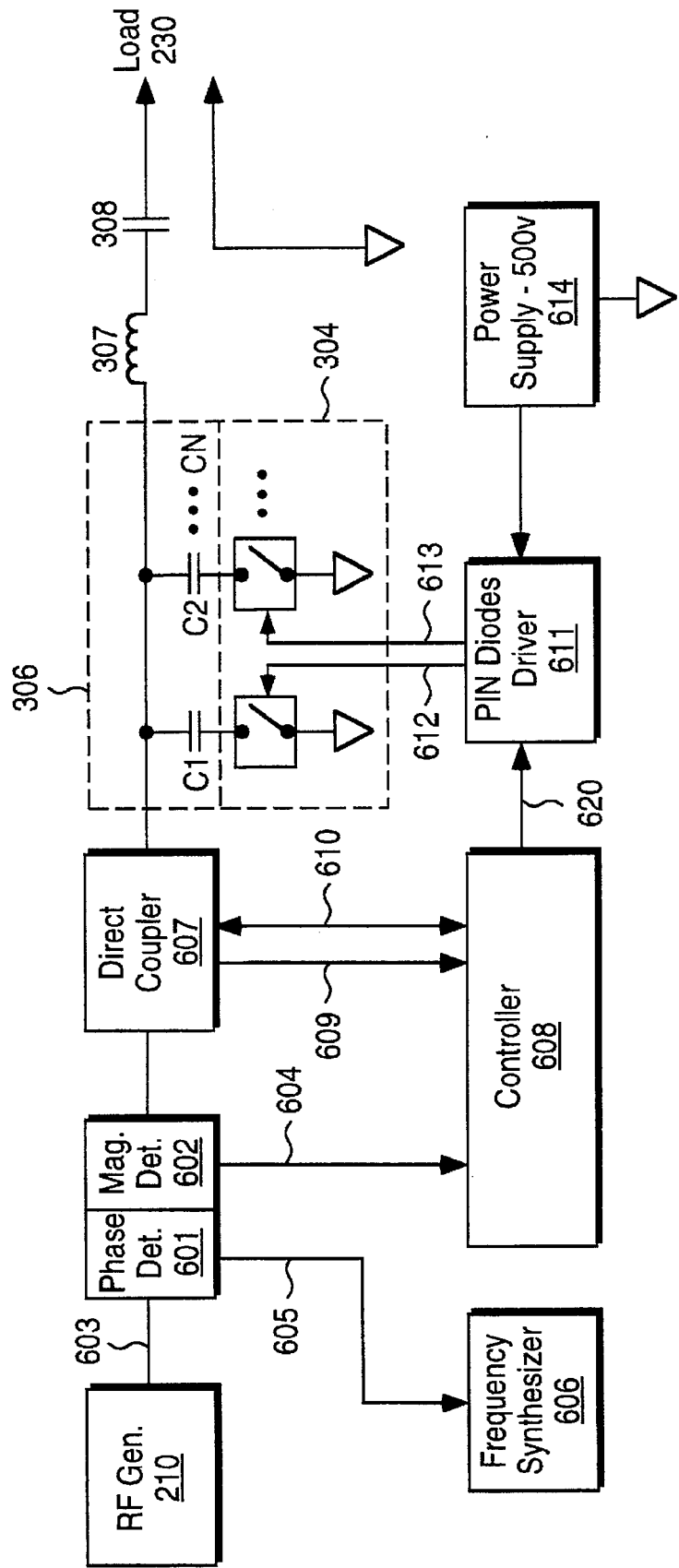
FIG. 6 illustrates a preferred embodiment of the present invention.

The output of the impedance matching network 220 is a series resonant circuit that presents the conjugate impedance to the load for impedance matching. The present invention utilizes an L-type impedance matching network in a low pass configuration. With reference to FIG. 6, the network comprises a shunt capacitance 306 and a series inductance 307. The capacitance 306 reduces any inductive impedance in the load 230, while the inductance 307 resonates with, i.e., cancels, any capacitive reactive component present in the Load. In one embodiment, the capacitance 306 (also referred to as load capacitance) is electronically variable by way of PIN diode-controlled switch circuit 304 whenever the magnitude of the input impedance deviates from the internal impedance of the power generator 210, e.g., 50 ohms. In a second embodiment, switch circuit 304 may be controlled by RF relays (not shown).

A magnitude detector 602 samples impedance on the transmission line 603 at e.g., 50 ohms, and generates a signal 604 that switches on a bank of one or more shunt capacitors comprising capacitance 306 via their respective PIN diodes, depending on the magnitude of the input impedance which varies according to the load. The polarity of the signal governs whether there is an increase or decrease in shunt capacitance 306. In either case, the inductance provided by series inductance 307 remains unchanged.

While capacitance 306 is illustrated as having two fixed shunt capacitors C1 and C2, any number of capacitors in parallel may be utilized. The greater the number of capacitors, the more accurate the adjustment possible in matching the input impedance to the load impedance. However, from a practical point of view, there is no reason to increase the number of capacitors beyond a certain number, e.g., 8 or 16, to obtain a full range of discrete values. The capacitors being switched, e.g., C1 and C2, each have a value that is one half the value of the previous capacitor. For example, if C1=400 pF, then C2=200 pF, and capacitor C(n) is one half the capacitance of capacitor C(n−1), etc.

The phase and magnitude detectors are coupled to a directional coupler 607. The directional coupler 607 outputs two signals, 609 and 610, which represent both incident and reflective power. These signals are coupled to a controller 608. The controller 608 contains well known devices such as a multiplier/divider chip, a comparator, an analog to digital converter, and a buffer. The controller 608 evaluates the signals thus input, compares them with a reference signal, and generates control voltages to drive a PIN diode driver circuit 611. The PIN diode driver circuit 611 enables the switching devices, i.e., PIN diodes, in switch circuit 304 via lines 612 and 613. The PIN diodes are switched on according to the signals received from the PIN diode driver circuit 611, which in turn is controlled by controller 608. If the PIN diodes receive no signal, they are biased into a cutoff state, i.e., no conduction. The combination of capacitors switched on is selected for the best impedance match between the RF generator 210 and the load 230.

Figure 7:
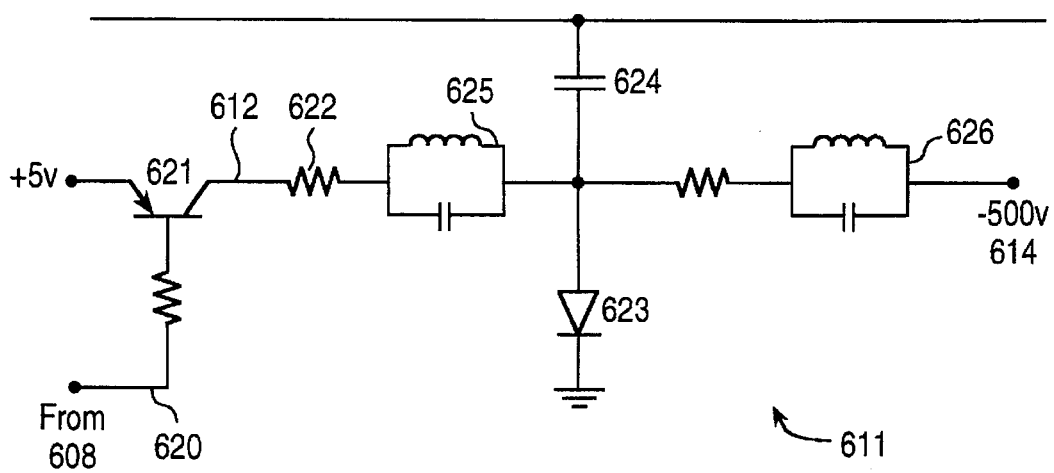
FIG. 7 is a circuit diagram of the PIN diodes driver in FIG. 6.

In FIG. 7, the PIN diodes driver is illustrated, where, for example, PIN diode 623 is turned on and capacitor 624 is thus connected to ground via a low resistance PIN diode. To turn on PIN diode 623, a control line 620 driven by controller 608, transmits zero volts, or a logical zero, turning transistor 621 on and forward biasing PIN diode 623 with current (0.5 amps of direct current in the preferred embodiment). Resistor 622 controls the DC bias current. At that high DC current in the forward direction, PIN diode 623 exhibits very low dynamic resistance (about 0.1 ohm in the preferred embodiment), thereby shorting capacitor 624 to ground. When control line 20 is driven high, e.g., 5 volts, by controller 608, the transistor 621 is in an off state—no DC current flows in the forward direction. At the same time, negative voltages (−500 volts in the preferred embodiment) appear on the p- side of the PIN diode 623, forcing the PIN diode to an off state. The LC networks 625 and 626 operate as filters resonating at the RF frequency, e.g., 13.56 MHz and not allowing RF signals to reach the power supply 614.

Figure 1:
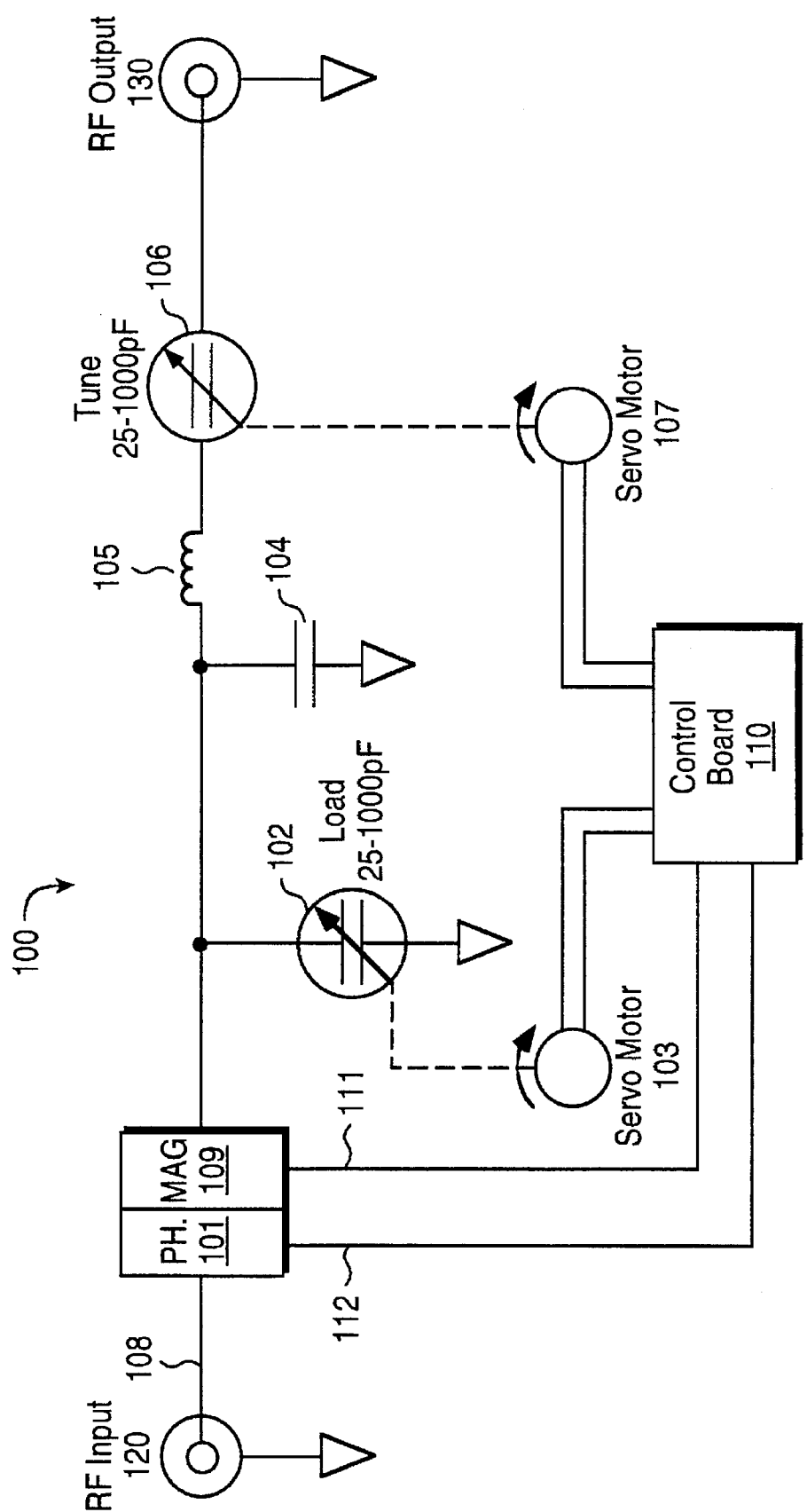
FIG. 1 illustrates an embodiment of a prior art impedance matching network as may be utilized by an RF power generator to match the impedance of the generator and an attached load.

FIG. 6 futher illustrates phase detector 601. Whereas in the prior art illustrated in FIG. 1, the phase detector was used to control capacitance, the preferred embodiment of the present invention utilizes the phase detector only to control the frequency of the applied voltage. The phase detector 601 samples the impedance on the transmission line 603 at 50 ohms and generates a signal 605 that controls a frequency synthesizer circuit 606. To match the impedance of the load, the frequency synthesizer circuit 606 adjusts, via line 630, the frequency of the applied voltage provided by the RF generator 210 according to the phase detector signal 605. Frequency changes in the applied voltage during normal plasma chamber operation are typically less than 1 MHz. Thus, the frequency changes of the RF power generator can be limited to a commensurate upper and lower limit. It is desirable to so limit the frequency because filters and other circuits in the impedance matching network are optimized for this particular frequency range. Moreover, it is possible to stay within the 1 MHz limit and have a full range of acceptable impedance load variations.

There are, of course, alternatives to the described embodiment which are within the understanding of one of ordinary skill in the relevant art. The present invention is intended to be limited only by the claims presented below.

What is claimed is:

1. An impedance matching network coupling a radio frequency power generator (RFPG) to a load, comprising:

a phase detector coupled to said RFPG, said phase detector detecting a phase shift in a voltage and a current provided by said RFPG;

a magnitude detector coupled to said RFPG, said magnitude detector detecting a magnitude of an impedance of said load;

a first capacitance coupled in parallel to said load;

an inductance coupled in series with said load;

a second capacitance coupled in series with said load;

a switching circuit coupled to said magnitude detector for coupling and decoupling said first capacitance to ground depending on said magnitude of said impedance of said load detected by said magnitude detector.

2. The impedance matching network of claim 1 wherein said first capacitance is further comprised of a plurality of capacitors coupled in parallel to said load.

3. The impedance matching network of claim 2 wherein said plurality of capacitors equals at least 8 capacitors.

4. The impedance matching network of claim 2 wherein said plurality of capacitors equals at least 16 capacitors.

5. The impedance matching network of claim 2 wherein each one of said plurality of capacitors has a fixed value of capacitance.

6. The impedance matching network of claim 5 wherein each one of said plurality of capacitors has a value of capacitance generally one-half the value of capacitance as a previous capacitor in said plurality of capacitors.

7. The impedance matching network of claim 2 wherein said switching circuit is comprised of a plurality of diodes each coupled to one of said plurality of capacitors for coupling and decoupling said one of said plurality of capacitors to ground.

8. The impedance matching network of claim 7 wherein each one of said plurality of diodes has a large intrinsic region between a p-doped semiconducting region and an n-doped semiconducting region.

9. The impedance matching network of claim 2 wherein said switching circuit is comprised of a plurality of radio frequency relays, each coupled to one of said plurality of capacitors for coupling and decoupling one of said plurality of capacitors to ground.

10. An impedance matching network coupled to a transmission line, said transmission line coupling a radio frequency power generator to a load, said impedance matching network comprising:

a phase detector coupled to said transmission line, said phase detector detecting a phase shift in a voltage and a current on said transmission line;

a frequency synthesizer circuit coupled to said phase detector, said frequency synthesizer circuit changing the frequency of said voltage depending on said phase shift in said voltage and said current on said transmission line detected by said phase detector;

a magnitude detector coupled to said transmission line, said magnitude detector detecting an impedance on said transmission line;

a plurality of capacitors coupled to said transmission line parallel to said load;

an inductance coupled to said transmission line in series with said load;

a capacitance coupled to said transmission line in series with said load, said capacitance, said plurality of capacitors, and said inductance forming an L-type impedance matching network;

a plurality of switches, each coupled to one of said plurality of capacitors, said plurality of switches coupling and decoupling said plurality of capacitors to a ground depending on said impedance of said transmission line detected by said magnitude detector; and, a controller coupled to said magnitude detector and said plurality of switches for controlling said plurality of switches depending on said magnitude of said impedance on said transmission line.

11. The impedance matching network of claim 10 further comprising a resistance coupled to said transmission line parallel to said load, said resistance maintaining said plurality of capacitors in a discharged state depending on said magnitude of said impedance of said transmission line.

12. The impedance matching network of claim 10 wherein said plurality of capacitors equals 8 capacitors.

13. The impedance matching network of claim 10 wherein said plurality of capacitors equals 16 capacitors.

14. The impedance matching network of claim 10 wherein each one of said plurality of capacitors has a fixed value of capacitance.

15. The impedance matching network of claim 10 wherein said plurality of switches is comprised of a plurality of diodes each coupled to one of said plurality of capacitors for coupling and decoupling said one of said plurality of capacitors to said ground.

16. The impedance matching network of claim 15 wherein each one of said plurality of diodes is a PIN diode.

17. The impedance matching network of claim 10 wherein said plurality of switches is comprised of a plurality of radio frequency relays each coupled to one of said capacitors for coupling and decoupling said one of said plurality of capacitors to said ground.

* * * * *